(12) United States Patent
Haque et al.

(10) Patent No.: US 8,378,332 B2
(45) Date of Patent: Feb. 19, 2013

(54) NANOWIRES

(75) Inventors: Samiul Haque, Cambridge (GB);
Richard White, Cambridge (GB)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 13/338,402

(22) Filed: Dec. 28, 2011

(65) Prior Publication Data

US 2012/0091432 A1   Apr. 19, 2012

Related U.S. Application Data

(63) Continuation of application No. 12/454,791, filed on May 22, 2009, now Pat. No. 8,115,190.

(51) Int. Cl.
*H01L 29/06* (2006.01)
(52) U.S. Cl. .......... 257/9; 257/500; 438/401
(58) Field of Classification Search .......... 257/9, 500; 438/401
See application file for complete search history.

(56) References Cited

U.S. PATENT DOCUMENTS

| | | | |
|---|---|---|---|
| 7,662,706 B2 | 2/2010 | Samuelson et al. | 438/503 |
| 2006/0057360 A1* | 3/2006 | Samuelson et al. | 428/323 |
| 2006/0225162 A1* | 10/2006 | Yi | 977/754 |
| 2007/0194467 A1* | 8/2007 | Yang et al. | 257/E23.155 |
| 2008/0009434 A1* | 1/2008 | Reches et al. | 514/2 |
| 2008/0179586 A1 | 7/2008 | Kamins | 257/9 |
| 2008/0218740 A1* | 9/2008 | Williams et al. | 356/72 |
| 2009/0045720 A1 | 2/2009 | Lee et al. | 313/503 |
| 2009/0059982 A1* | 3/2009 | Kamins et al. | 372/43.01 |
| 2010/0075130 A1 | 3/2010 | Meng et al. | 428/315.5 |

FOREIGN PATENT DOCUMENTS

| | | |
|---|---|---|
| EP | 2 048 492 A1 | 4/2009 |
| WO | WO 2005/054121 A2 | 6/2005 |
| WO | WO 2006/060476 A2 | 6/2006 |
| WO | WO 2008/033303 A2 | 3/2008 |

OTHER PUBLICATIONS

J. Mallet et al. "Growth of Silicon Nanowires of Controlled Diameters by Electrodeposition in Ionic Liquid at Room Temperature" Nano Letters 2008, Publication Date Sep. 13, 2008, vol. 8, No. 3468-3474; downloaded from http://pubs.acs.org on May 11, 2009.

S Jin et al., "Scalable Interconnection and Integration of Nanowire Devices without Registration", Nano Letters 2004, vol. 4, No. 5, 915-919.

R. Wagner et al. "Vapor-Liquid-Solid Mechanism of Single Crystal Growth", App. Phys. Lett AIP, Mar. 1, 1964, vol. 4, No. 5.

H. Chandrasekaran, "Rationalization of Nanowire Synthesis Using Low-Melting Point Metals", J. Phys. Chem B, Jun. 26, 2006, 110, 18351-18357.

Y. Cui, "Diameter-Controlled Synthesis of Single-Crystal Silicon Nanowires", Applied Phyiscs Letters, vol. 78, No. 15 Apr. 9, 2001.

(Continued)

*Primary Examiner* — Phuc Dang
(74) *Attorney, Agent, or Firm* — Harrington & Smith

(57) ABSTRACT

An apparatus and a method of manufacturing the apparatus. The apparatus includes a main nanowire and branch nanowires emanating from the main nanowire. The main nanowire may have a first portion and a second portion. The first portion may have a first carrier concentration and the second portion may have a second carrier concentration, different to the first carrier concentration. Each branch nanowire may emanate from the first portion of the main nanowire. Each branch nanowire may emanate from the main nanowire at a substantially fixed distance along a length of the main nanowire.

13 Claims, 5 Drawing Sheets

OTHER PUBLICATIONS

Y. Cui et al. "Functional Nanoscale Electronic Devices Assembled Using Silicon Nanowire Building Blocks", Science, 291 851 (20001) DOI: 10.1126/Science.291.5505.851.

Z. Wang "Zinc Oxide Nanostructures: Growth, Properties and Application", Institue of Physics Publishing, J. Phys.: Condens, Matter 16 (2004) R829-R858.

Z. Pan et al., "Molten Gallium as a Catalyst for the Large-Scale Growth of Highly Aligned Silica Nanowires", J. Am Chem. Soc. vol. 124, No. 8, 2002.

S. May et al., "Dendritic Nanowire Growth Mediated by a Self-Assembled Catalyst" Adv. Mater 17, No. 5 Mar. 8, 2005.

Y. Huang et al., "Directed Assembly of One-Dimensional Nanostructures into Functional Networks", Jan. 26, 2001, vol. 291, www.sciencemag.org.

E. Dattoli et al., "Electrical Characterization of Silicon Nanowire P-N. Junctions", NSF EE RUE Penn Stat Annual Research Journal, vol. III (2005).

* cited by examiner

NANOWIRES

This application is a continuation of U.S. application Ser. No. 12/454,791, filed on May 22, 2009, now U.S. Pat. No. 8,115,190.

FIELD OF THE INVENTION

Embodiments of the present invention relate to nanowires. In particular, they relate to semiconductor nanowire structures.

BACKGROUND TO THE INVENTION

Nanowires are nanostructures that may be used to construct very small scale circuits.

BRIEF DESCRIPTION OF VARIOUS EMBODIMENTS OF THE INVENTION

According to various, but not necessarily all, embodiments of the invention there is provided an apparatus, comprising: a main nanowire having a first portion and a second portion, the first portion having a first carrier concentration and the second portion having a second carrier concentration, different to the first carrier concentration; and a plurality of branch nanowires, each branch nanowire emanating from the first portion of the main nanowire.

The main nanowire may be elongate and have a length. The plurality of branch nanowires may emanate from the main nanowire at a substantially fixed distance along the length of the main nanowire.

The main nanowire may comprise a junction that is substantially perpendicular to the length of the main nanowire. The junction may separate the first portion of the main nanowire and the second portion of the main nanowire.

At least a portion of each branch nanowire may have the first carrier concentration. Each branch nanowire may comprise a junction separating the portion having the first carrier concentration and a portion having a third carrier concentration.

The third carrier concentration may be different to the first carrier concentration and the second carrier concentration. The first carrier concentration, the second carrier concentration and the third carrier concentration may be such that at least one built in potential difference is present across the apparatus.

According to various, but not necessarily all, embodiments of the invention there is provided an apparatus, comprising: an elongate main nanowire having a length; and a plurality of branch nanowires, each branch nanowire emanating from the elongate main nanowire at a substantially fixed distance along the length of the elongate main nanowire.

The substantially fixed distance may be at an end of the length of the elongate main nanowire. Each branch nanowire may emanate from the end of the length of the elongate main nanowire.

The apparatus may further comprise at least one junction separating nanowire portions having different carrier concentrations.

The apparatus may comprise a junction separating first and second portions in the elongate main nanowire having different carrier concentrations.

The apparatus may comprises a plurality of junctions. Each junction may separate a branch nanowire portion having a first carrier concentration and an elongate main nanowire portion having a second carrier concentration. Each junction may be situated at an interface between a branch nanowire and the elongate main nanowire. Alternatively, each junction may be situated at a position away from an interface between a branch nanowire and the elongate main nanowire.

According to various, but not necessarily all, embodiments of the invention there is provided a method, comprising: growing a main nanowire; and applying further material to the main nanowire through an aperture in a mask, in order to grow a plurality of branch nanowires, using the further material, from the main nanowire.

The main nanowire may have a length. The aperture in the mask may enable the further material to be applied to the main nanowire at a substantially fixed distance along the length. The substantially fixed distance may be at an end of the length of the main nanowire.

The main nanowire may be grown by applying material through the aperture in the mask. The mask may restrict how the main nanowire grows. It may be that the mask does not restrict how the branch nanowires grow from the main nanowire. The main nanowire may be grown without using a mask.

A method may further comprise: growing the plurality of branch nanowires, using the further material, from the main nanowire.

The main nanowire may be grown using electrodeposition. The branch nanowires may be grown using a vapor liquid solid process.

BRIEF DESCRIPTION OF THE DRAWINGS

For a better understanding of various examples of embodiments of the present invention reference will now be made by way of example only to the accompanying drawings in which.

DETAILED DESCRIPTION OF VARIOUS EXEMPLARY EMBODIMENTS OF THE INVENTION

Figure 1:
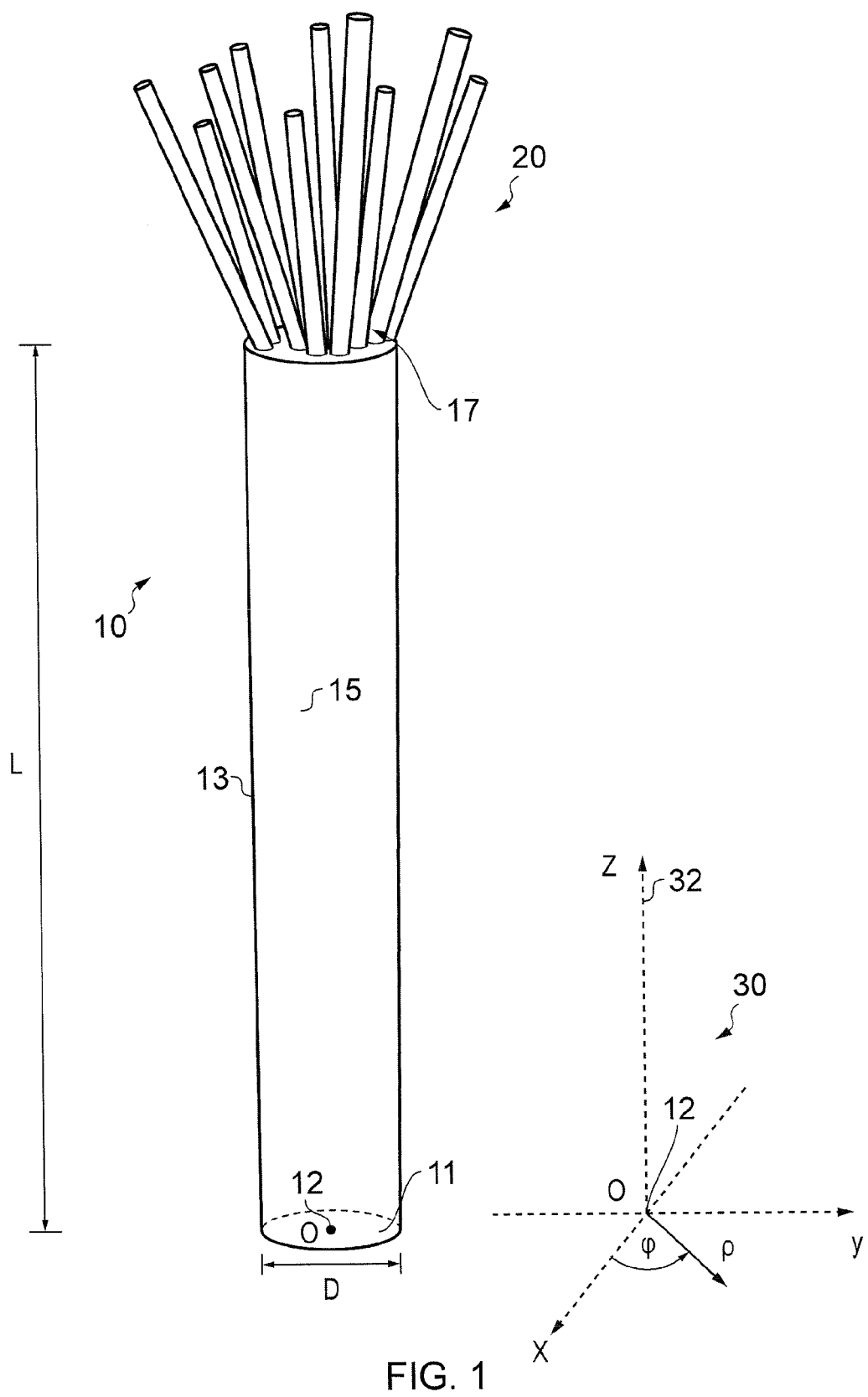
FIG. 1 illustrates an apparatus and a cylindrical co-ordinate system.

The Figures illustrate an apparatus 10, comprising: an elongate main nanowire 13 having a length L; and a plurality of branch nanowires 20, each branch nanowire emanating from the elongate main nanowire 13 at a substantially fixed distance along the length L of the elongate main nanowire 13.

The Figures also illustrate an apparatus 10, comprising: a main nanowire 13 having a first portion 18 and a second portion 14, the first portion 18 having a first carrier concentration and the second portion 14 having a second carrier concentration, different to the first carrier concentration; and a plurality of branch nanowires 20, each branch nanowire emanating from the first portion 18 of the main nanowire 13.

FIG. 1 illustrates an apparatus 10. The apparatus 10 may, for example, be a nanostructure. The nanostructure may be a nanocomponent for use in circuitry. For instance, some or all of the apparatus 10 may be made from a semiconductor material.

The apparatus 10 comprises a main nanowire 13 and a plurality of branch nanowires 20. The main nanowire 13 and the branch nanowires 20 may be integrally formed.

The main nanowire 13 may be elongate and may, for example, be roughly cylindrical in shape. In the illustrated example, the main nanowire 13 has a smooth, curved outer surface 15, although this need not be the case. The cylinder has a length L and a diameter/width D. The diameter/width D of the main nanowire 13 may, for example, be somewhere between 300 nanometers (nm) and 1 micron. The length L of the main nanowire 13 may be many times larger than the diameter/width.

FIG. 1 also illustrates a cylindrical co-ordinate system ($\rho$, $\phi$, z) designated with the reference numeral 30. The z-axis 32 defines a height relative to the origin 12 of the co-ordinate system 30. $\rho$ defines a radial distance from the z-axis 32. $\phi$ defines an azimuth around the z-axis 32. x and y axes are also shown in FIG. 1 for illustrative purposes. In this example, the azimuth $\phi$ is measured counter-clockwise from the x-axis.

In this example, the origin 12 of the cylindrical co-ordinate system 30 is considered to be at the centre of a surface 11 at the end of the main nanowire 13 (as shown in FIG. 1). In this instance, the surface 11 is a face at one end of the length L of the main nanowire 13. The cylindrical co-ordinate system 30 may be used to define points within or around the apparatus 10.

Each one of the branch nanowires 20 may emanate from the main nanowire 13 at a substantially fixed distance along the length L of the main nanowire 13. For example, the branch nanowires 20 may emanate from a segment of the main nanowire 13 that is defined by a substantially fixed value on the z-axis 32 and variable values of p and cp. Each of the branch nanowires 20 may, for example, have a width/diameter that is somewhere between 2 nm and 100 nm.

In the example illustrated in FIG. 1, every one of the branch nanowires 20 emanates from a surface 17 at the end of the main nanowire 13. In this instance, the surface 17 is a face at the end of the length L of the main nanowire 13. The surface 17 effectively represents an interface between the main nanowire 13 and the branch nanowires 20.

Each branch nanowire 20 emanates from a different point on the surface 17. For each of these points, z=L, and $\rho$ and $\phi$ may take any one of a number of values within the boundary of the surface 17.

The surface 17 from which the branch nanowires 20 emanate is at the opposite end of the main nanowire 13 to the surface 11 where the origin of the cylindrical co-ordinate system 30 is situated.

In some other embodiments of the invention, some of all of the branch nanowires 20 may not emanate from the surface 17 at the end of the main nanowire 13. For example, the branch nanowires 20 may emanate from a segment of the main nanowire 13 that is defined by a substantially fixed value on the z-axis that is not equal to L, and variable values of $\rho$ and $\phi$. Alternatively, some or all of the branch nanowires 20 may emanate from the outer surface 15 of the main nanowire 13, at various different points along the z-axis 32.

Figure 2:
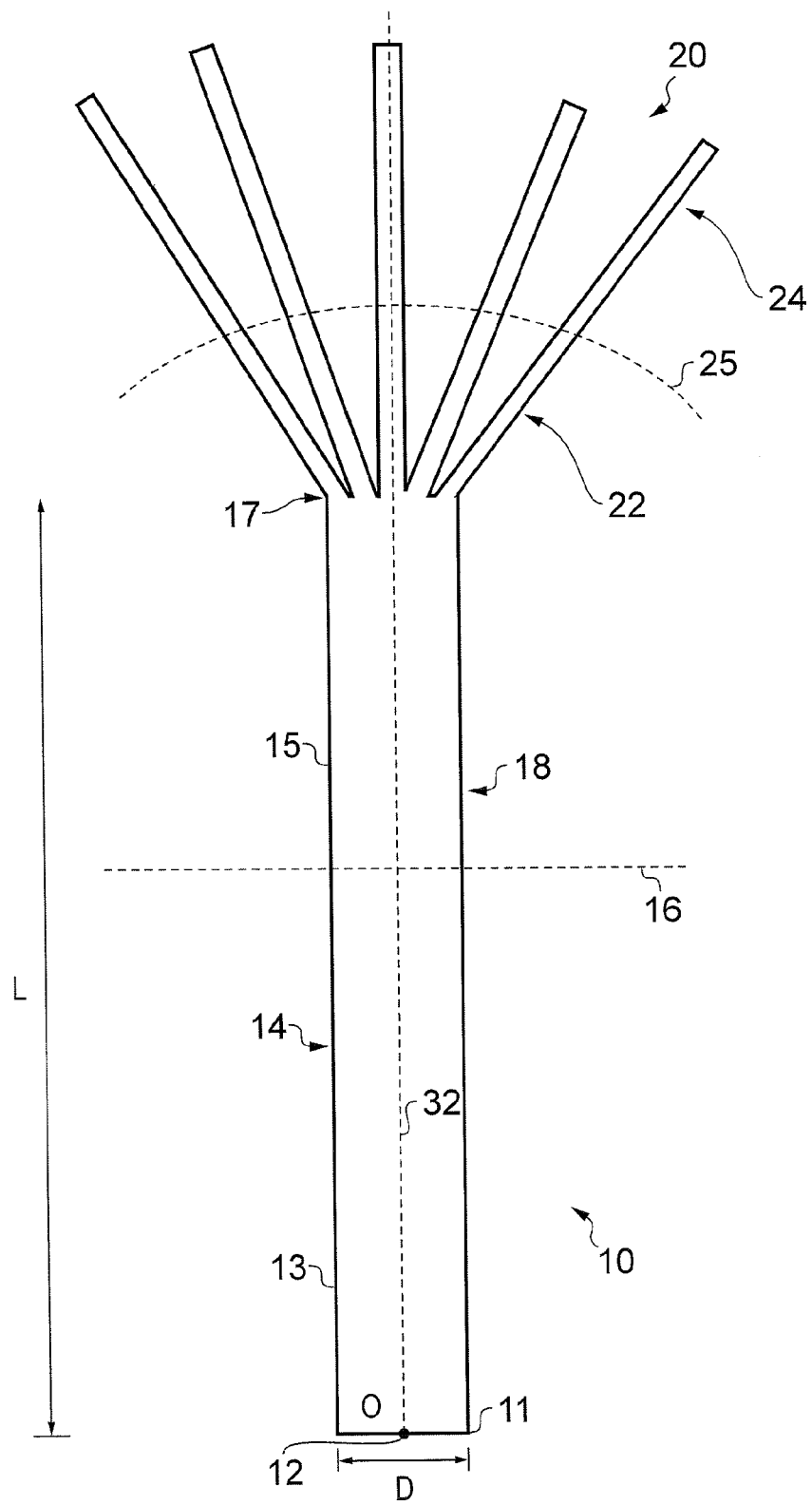
FIG. 2 illustrates a first two-dimensional schematic of an apparatus.

FIG. 2 illustrates an example of a two-dimensional schematic of an apparatus 10 having the same form as that illustrated in FIG. 1. In this example, the main nanowire 13 comprises a junction, which separates a first portion 18 of the main nanowire 13 from a second portion 14 of the main nanowire 13. The position of the junction is illustrated by a dotted line 16. In this example, the junction 16 is substantially perpendicular to the length L of the main nanowire 13 and substantially parallel to the diameter/width D and the end surfaces 11, 17 of the main nanowire 13.

In this example, each (and every) one of the branch nanowires 20 also comprises a junction. The junctions are illustrated by the dotted line 25 in FIG. 1. Each junction 25 separates a first portion 22 of a branch nanowire from a second portion 24 of a branch nanowire.

The junctions 16, 25 in the main nanowire 13 and the branch nanowires 20 may separate semiconductor materials of different types. For example, the first portion 18 of the main nanowire 13 and the first portion 22 of the branch nanowires 20 may be a first type of semiconductor material. The second portion 14 of the main nanowire 13 may be a second type of semiconductor material. The second portion 24 of the branch nanowires 20 may be a third type of semiconductor material.

The first type of semiconductor material may have a first carrier concentration; the second type of semiconductor material may have a second carrier concentration; and the third type of semiconductor material may have a third carrier concentration.

The first, second and third semiconductor materials may have the same "base semiconductor material" (which may be, for example, a group IV semiconductor such as silicon or germanium, or a compound semiconductor including II-VI or III-V semiconductors), but have different levels of doping and/or different dopants. If the first, second and third semiconductor materials have different levels of doping and/or different dopants, the first, second and third carrier concentrations of the first, second and third semiconductor materials are considered to be different.

For example, in some implementations, the apparatus 10 may have a p-i-n structure. In these implementations, the third type of semiconductor material (from which the second portion 24 of the branch nanowires 20 is formed) is a p-type material. The first type of the semiconductor material (from which the first portion 18 of the main nanowire 13 and the first portion 22 of the branch nanowires 20 is formed) is an intrinsic semiconductor. The second type of semiconductor material (from which the second portion 14 of the main nanowire 13 is formed) is an n-type material.

If the apparatus 10 has a p-i-n structure, the junctions 25 in the branch nanowires 20 are p-i junctions and the junction 16 in the main nanowire 13 is an i-n junction.

When the p-i junctions 25 are formed, holes from the p-type material diffuse into the intrinsic material, leaving a depletion region in the p-type material. The depletion region in the p-type material includes negatively charged ions.

When the i-n junction 16 is formed in the main nanowire 13, electrons from the n-type material diffuse into the intrinsic material, leaving a depletion region in the n-type material. The depletion region in the n-type material includes positively charged ions.

An electric field from the positively charged ions in the n-type material to the negatively charged ions in the p-type material means that the p-i-n structure has a built-in potential.

The p-i-n structure effectively acts as a diode. If the p-i-n structure is forward biased, it conducts electricity, allowing conventional current to flow from the p-type material to the n-type material. Thus, if the apparatus 10 has a p-i-n structure, it may be used as a summation node (to sum signals) in a circuit. Alternatively, if the p-i-n structure is reverse biased, it generally does not conduct electricity.

Alternatively, in other implementations, the apparatus 10 illustrated in FIG. 2 may have an n-i-p structure. In these implementations, the junctions 25 in the branch nanowires 20 are n-i junctions and the junction 16 in the main nanowire 13 is an i-p junction. The n-i-p structure effectively acts as a diode. If the n-i-p structure is forward biased, it conducts electricity, allowing conventional current to flow from the n-type material to the p-type material. Thus, if the apparatus has a n-i-p structure, it may be used as a splitter node (to split signals) in a circuit. Alternatively, if the n-i-p structure is reverse biased, it generally does not conduct electricity.

In further implementations, the apparatus 10 may have a p-n-p structure or an n-p-n structure. In these implementations, the apparatus 10 may act as a transistor, such as a field effect transistor or a bipolar transistor. A controlling electrode may be provided to enable the apparatus 10 to function as a transistor. For example, if the apparatus 10 is configured to function as a field effect transistor, the controlling electrode may be a gate electrode. If the apparatus 10 is configured to function as a bipolar transistor, the controlling electrode may be a base electrode.

Figure 3:
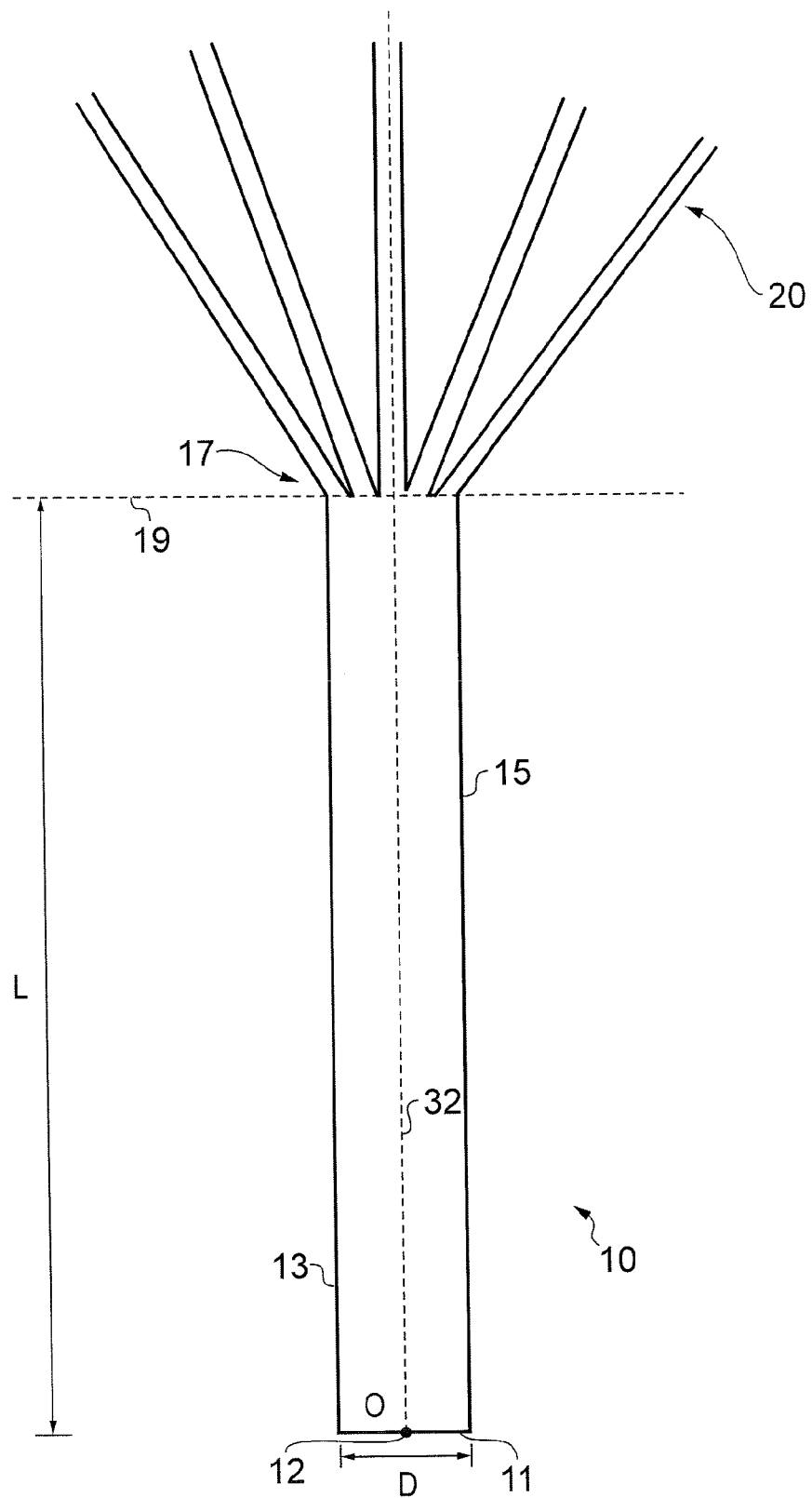
FIG. 3 illustrates a second two-dimensional schematic of an apparatus.

FIG. 3 illustrates a further example of a two-dimensional schematic of an apparatus 10 having the same form as that illustrated in FIG. 1. In this example, the branch nanowires 20 are formed of a first semiconductor material and the main nanowire is formed of a second, different, semiconductor material.

In this example, junctions are present at the interface 17 between each (and every) branch nanowire 20 and the main nanowire 13. The junctions are illustrated by the dotted line 19.

In some implementations of the invention, the branch nanowires 20 are made from a p-type material and the main nanowire 13 is made from an n-type material. In these implementations, the p-n structure effectively acts as a diode. If the p-n structure is forward biased, it conducts electricity, allowing conventional current to flow from the p-type material to the n-type material. Thus, if the apparatus 10 has a p-n structure, it may be used as a summation node (to sum signals) in a circuit.

In other implementations, the branch nanowires 20 are made from a n-type material and the main nanowire 13 is made from an p-type material. In these implementations, the n-p structure effectively acts as a diode. If the n-p structure is forward biased, it conducts electricity, allowing conventional current to flow from the n-type material to the p-type material. Thus, if the apparatus 10 has a n-p structure, it may be used as a splitter node (to split signals) in a circuit.

The apparatuses 10 described above in relation to FIGS. 1, 2 and 3 may have various different applications. For example, the apparatuses 10 may be used in an artificial neural network or any other nanoelectronic architecture (for example, as a summation node) or in nanosensor arrays where the branch nanowires 20 may operate as individual sensors (for example, for the detection of biological or chemical species) and their individual responses are summed together at the interface with the main nanowire.

A method of manufacturing an apparatus 10 in accordance with embodiments of the invention will now be described in relation to FIG. 4 and FIG. 5.

Figure 5:
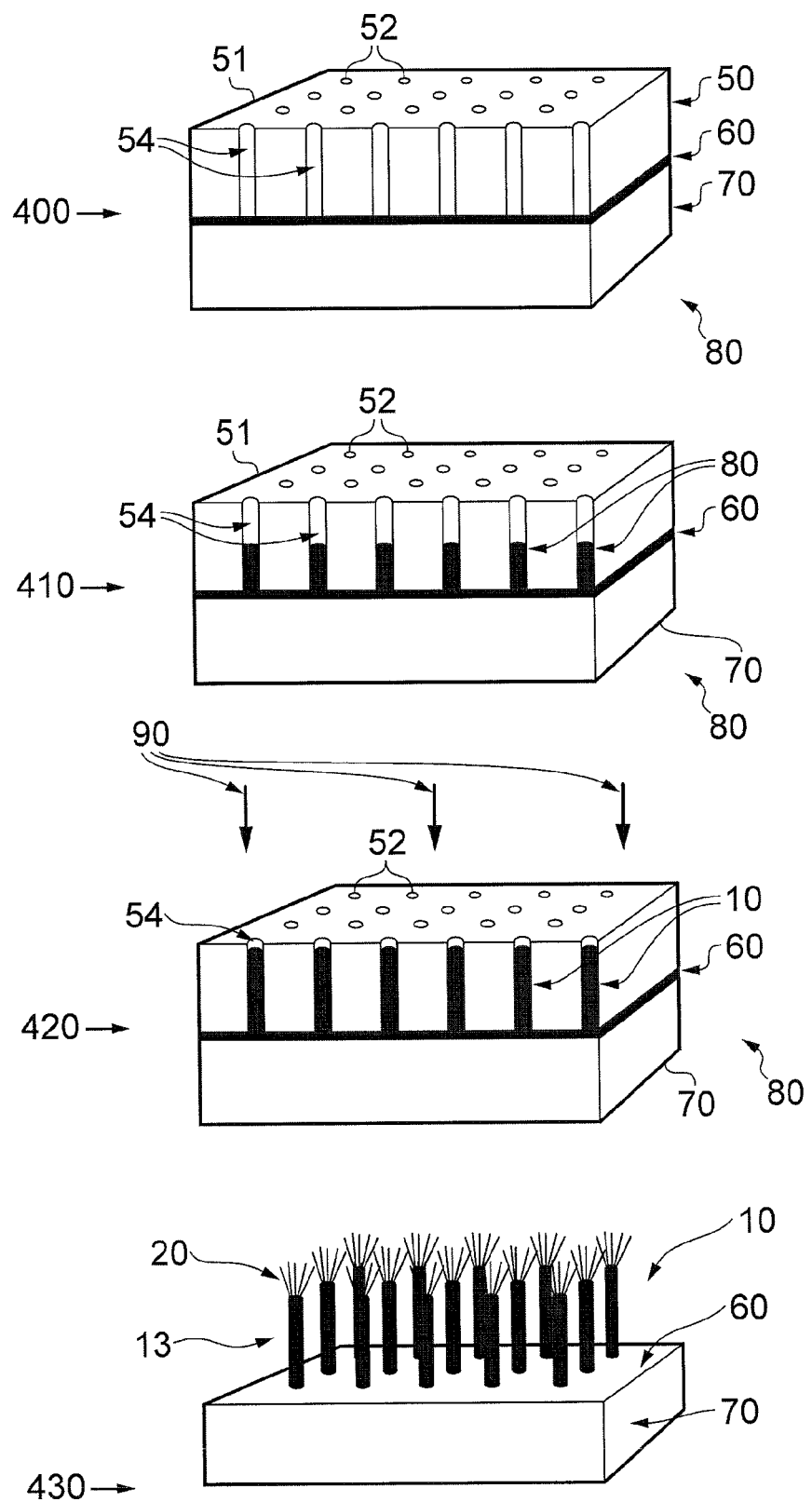
FIG. 5 illustrates various stages in the growth of an apparatus.

The first drawing on FIG. 5 (designated with the reference numeral 400) illustrates a sandwich structure 80 comprising a substrate 70, a mask 50 and a cathode 60 sandwiched between the substrate 70 and the mask 50.

The substrate 70 may, for example, be a silicon wafer or a glass slide. The mask 50 may, for example, be a porous membrane such as an anodic aluminum oxide film or a polycarbonate film. The cathode 60 may, for example, be a sputtered or evaporated metal film.

An outer surface 51 of the mask 50 comprises a plurality of apertures/pores 52. Each aperture 52 defines an elongate chamber 54 that extends through the mask 50 to the cathode 60.

Figure 4:
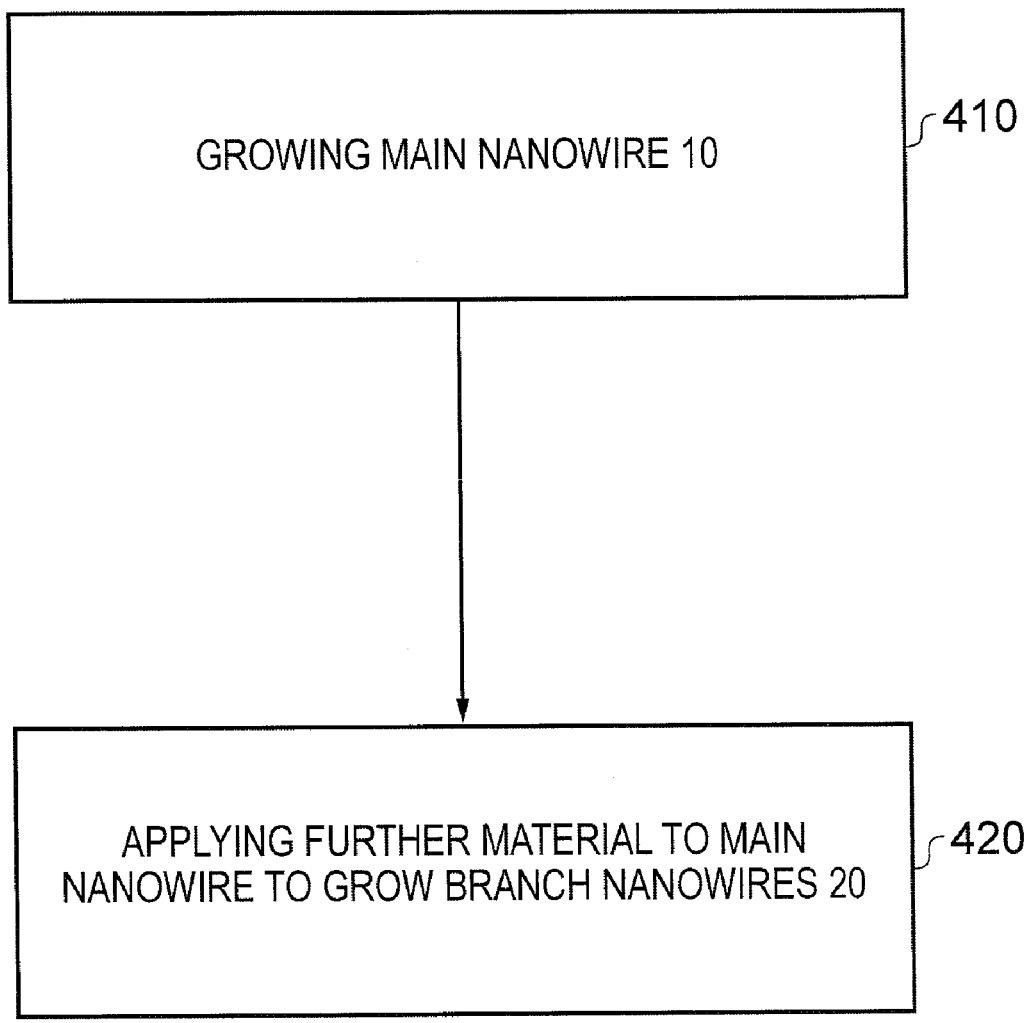
FIG. 4 illustrates a method.

At block 410 of the method illustrated in FIG. 4, a main nanowire 13 is grown by applying a material through an aperture in the mask 50. This is shown illustratively by the drawing that is also designated with the reference numeral 410 in FIG. 5.

A plurality of main nanowires may be grown using a first growth process. In this example, the first growth process is electrodeposition. A salt compound that comprises a substance to be deposited into the chambers 54 of the mask 50 is dissolved in an electrolyte solution. For example, if one wishes to make main nanowires from silicon, the salt compound is a silicon salt such as silicon tetrachloride ($SiCl_4$). The salt compound is dissociated into its constituent parts ($Si^{2+}$ and $4Cl_4^-$, in the case of $SiCl_4$) when it is in the electrolyte solution.

The cathode 60 of the structure 80 is one of two electrodes that form part of an electrical circuit. The electrolyte solution contains ions which permit current flow between the two electrodes.

The sandwich structure 80, comprising the cathode 60, and the other electrode (the anode) are immersed in the electrolyte solution comprising the dissolved salt compound. When a direct current is applied between the cathode 60 and the anode, the cations in the electrolyte solution (silicon cations in the case of $SiCl_4$) are attracted to the cathode 60. The cations travel though the apertures 52 in the mask 50 and into the chambers 54 before reaching the surface of the cathode 60. The cations are reduced at the cathode 60, and thus deposit in elemental form (with no charge) in the chambers 54 of the mask 50.

The acquisition of material (silicon, in this case) in the chambers 54 results in a main nanowire 13 being formed in each chamber. Each of the chambers 54 effectively acts to restrict the direction of growth of each main nanowire 13, such that a desired main nanowire shape is achieved. Each main nanowire 13 may be of the form illustrated in FIGS. 1, 2 and 3 and described above.

In order to create a doped main nanowire 13 and/or a main nanowire 13 comprising a junction (and two differently doped portions), the salt compound may be varied appropriately or an additional salt may be added to the electrolyte solution.

At block 420 of FIG. 4, further material is applied to a main nanowire through an aperture in the mask 50, in order to grow a plurality of branch nanowires, using the further material, from the main nanowire. This is shown illustratively by the drawing that is designated by the reference numeral 420 in FIG. 5.

The arrows 90 shown in drawing 420 in FIG. 5 illustrate the direction in which the further material is applied to the main nanowires that have been grown in the chambers 54. In this example, the further material is applied in a direction that is substantially perpendicular to the outer surface 51 of the mask 50.

As the further material is applied while the mask 50 is still in position around the main nanowires, the deposition of the further material is effectively confined to a particular part of the surface area of each main nanowire. For instance, the geometry of the mask 50 may be such that each aperture enables the further material to be deposited on to a part of the main nanowire 13 that is a fixed distance along the length of the main nanowire 13. In this example, the deposition is confined to an end surface 17 of each main nanowire (see FIGS. 1, 2 and 3 and the description above).

The further material may, for example, comprise silicon. In some embodiments of the invention, the further material comprises a catalyst. The catalyst may, for example, be gold. The further material may be applied by sputtering or evaporating a gold film, or depositing metal colloids.

After the further material has been applied to the main nanowires, a plurality of branch nanowires 20 is grown from each branch nanowire using a second growth process. The second growth process may, for example, be a vapor-liquid-solid process. The branch nanowires 20 may be doped and may comprise semiconductor junctions, as described above in relation to FIGS. 1, 2 and 3.

The mask 50 may or may not remain in place while the branch nanowires 20 are grown. If the mask 50 is in place, it does not restrict the direction of growth of the branch nanowires 20. The mask 50 may be removed by wet chemical etching, before or after the branch nanowires 20 are grown.

The branch nanowires 20 grow outwardly from the surface 17 on the main nanowire that the further material is applied to. The final drawing 430 in FIG. 5 illustrates the nanostructures 10 after the vapor-liquid-solid process has taken place and after the mask 50 has been removed. Each nanostructure 10 comprises a main nanowire 13 and a plurality of branch nanowires 20. Each of the nanostructures 10 may take the one of the forms described above in relation to FIG. 1, FIG. 2 and/or FIG. 3.

The above described method advantageously allows a nanostructure 10 to be formed where the each and every one of the branch nanowires 20 of the nanostructure 10 emanates from a particular part of a main nanowire 13 (such as from the end of the main nanowire 13). This advantageously enables a junction to be defined in the main nanowire 13 that is situated away from the interface between the branch nanowires 20 and the main nanowire 13, enabling the nanostructure 10 to be used as a summation node or a splitter node.

The illustration of the blocks in FIG. 4 does not necessarily imply that there is a required or preferred order for the blocks and the order and arrangement of the block may be varied. Furthermore, it may be possible for some steps to be omitted.

Although embodiments of the present invention have been described in the preceding paragraphs with reference to various examples, it should be appreciated that modifications to the examples given can be made without departing from the scope of the invention as claimed. For example, it will be appreciated that the method of manufacturing a nanostructure 10 described above is not necessarily the only method of manufacturing that nanostructure.

In alternative methods of manufacture, the main nanowire 13 and the branch nanowires 20 of a nanostructure 10 such as those described in FIG. 1, FIG. 2 and/or FIG. 3 may be grown using vapor-liquid-solid processes.

In some alternative methods of manufacture it is not necessary to put a mask in place prior to growing the main nanowires 13. For example, in one alternative method of manufacture, the main nanowires 13 are grown using a vapor liquid solid process without a mask in place. After the main nanowires 13 have been grown, a mask may be put in place, for instance by spin-coating a polymer film and oxygen plasma etching back to expose only the end surfaces of the main nanowires 13. The further material (for use in the growing branch nanowires 20) may then be applied to the end surfaces of the main nanowires 13.

In another alternative method of manufacture, the main nanowire 13 is formed using liquid alloy droplet comprising a metal (such as gold) and a semiconductor (such as silicon). The branch nanowires 20 may be formed by using a temperature change to cause a plurality of solid semiconductor nuclei to form from the liquid alloy droplet. Each solid semiconductor nucleus forms the seed for subsequent growth of a branch nanowire 20.

In some embodiments of the invention, the junction or junctions in the apparatus 10 may be situated in positions other than those described in relation to FIGS. 1, 2 and 3.

As described above, in some embodiments of the invention, the branch nanowires 20 and the main nanowire 13 of an apparatus 10 may be made from the same "base semiconductor material". In some alternate embodiments of the invention, the branch nanowires 20 are formed from a different base semiconductor material to the main nanowire 13, forming heterostructures. The formation of heterostructures may enable an appropriate band structure to be formed to control/restrict current flow in a particular direction.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus, comprising:
a main nanowire having a first portion and a second portion, the first portion having a first carrier concentration and the second portion having a second carrier concentration different from the first carrier concentration; and
a plurality of branch nanowires, each branch nanowire emanating from the first portion of the main nanowire.

2. An apparatus as claimed in claim 1 wherein the main nanowire is elongate and has a length, and the plurality of branch nanowires emanate from the main nanowire at a substantially fixed distance along the length of the main nanowire.

3. An apparatus as claimed in claim 2, wherein the main nanowire comprises a junction, substantially perpendicular to the length of the main nanowire, which separates the first portion of the main nanowire and the second portion of the main nanowire.

4. An apparatus as claimed in claim 1, wherein at least a portion of each branch nanowire has the first carrier concentration.

5. An apparatus as claimed in claim 4, wherein each branch nanowire comprises a junction separating the portion having the first carrier concentration and a portion having a third carrier concentration.

6. An apparatus as claimed in claim 5, wherein the third carrier concentration is different from the first carrier concentration and the second carrier concentration.

7. An apparatus as claimed in claim 5, wherein the first carrier concentration, the second carrier concentration, and the third carrier concentration are such that at least one built in potential difference is present across the apparatus.

8. An apparatus, comprising:
an elongate main nanowire having a length; and
a plurality of branch nanowires, each branch nanowire emanating from the elongate main nanowire at a substantially fixed distance along the length of the elongate main nanowire;

wherein the substantially fixed distance is at an end of the length of the elongate main nanowire, and each branch nanowire emanates from the end of the length of the elongate main nanowire.

9. An apparatus, comprising:

an elongated main nanowire having a length;

a plurality of branch nanowires, each branch nanowire emanating from the elongate main nanowire at a substantially fixed distance along the length of the elongate main nanowire; and at least one junction separating nanowire portions having different carrier concentrations.

10. An apparatus, comprising:

an elongate main nanowire having a length; and a plurality of branch nanowires, each branch nanowire emanating from the elongate main nanowire at a substantially fixed distance along the length of the elongate main nanowire;

wherein the apparatus comprises a junction separating first and second portions in the elongate main nanowire having different carrier concentrations.

11. An apparatus, comprising:

an elongate main nanowire having a length; and a plurality of branch nanowires, each branch nanowire emanating from the elongate main nanowire at a substantially fixed distance along the length of the elongate main nanowire;

wherein the apparatus comprises a plurality of junctions, each junction separating a branch nanowire portion having a first carrier concentration and an elongate main nanowire portion having a Second carrier concentration.

12. An apparatus as claimed in claim 11, wherein each junction is situated at an interface between a branch nanowire and the elongate main nanowire.

13. An apparatus as claimed in claim 11, wherein each junction is situated at a position away from an interface between a branch nanowire and the elongate main nanowire.

* * * * *